April 28, 1970 H. W. THIM 3,509,478

TWO-VALLEY SEMICONDUCTOR AMPLIFIER

Filed Dec. 29, 1966 2 Sheets-Sheet 2

TWO-VALLEY SEMICONDUCTOR AMPLIFIER

Filed Dec. 29, 1966 2 Sheets-Sheet 1

INVENTOR
H. W. THIM
BY
Roderick B. Anderson
ATTORNEY

3,509,478
TWO-VALLEY SEMICONDUCTOR AMPLIFIER

Hartwig W. Thim, Summit, N.J., assignor to Bell Telephone Laboratories, Incorporated, Murray Hill, N.J., a corporation of New York Filed Dec. 29, 1966, Ser. No. 605,644
Int. Cl. H03f *3/10;* H03b *7/14*
U.S. Cl. 330—5 9 Claims

ABSTRACT OF THE DISCLOSURE

An oscillating two-valley semiconductor diode is used as a microwave amplifier. In one embodiment, the diode is connected to a circulator and a tunable waveguide resonator. The resonator in an appropriate bias voltage establishes a negative resistance and Gunn-effect oscillations. With a proper selection of circuit and device parameters, signal energy reflected from the diode will be amplified with a reasonably low noise figure. An oscillator embodiment is also disclosed.

This invention relates to high frequency amplifiers, and more particularly, to amplifier circuits using two-valley bulk semiconductor diodes.

The structure and operation of a new family of semiconductor devices known variously as two-valley devices, bulk-effect devices, and Gunn-effect diodes, are described in detail in a series of papers in the January 1966 issue of "IEEE Transactions on Electron Devices," vol. ED–13, No. 1. As set forth in these papers, high frequency oscillations can be obtained by applying an appropriate direct current voltage across a suitable semiconductor wafer of substantially homogeneous constituency; i.e., a wafer that does not include any discernible p–n rectifying junctions. These oscillations result from the formation of discrete regions of high electric field intensity and corresponding space-charge accumulation, called domains, that travel from the negative to the positive contact at approximately the carrier drift velocity. The bulk material presents a negative differential resistance to internal currents in the region of the domain, causing the electric field intensity of the domain to grow as it travels toward the positive electrode.

The use of two-valley semiconductor devices as microwave amplifiers is described in the paper "Microwave Amplification in a Gas Bulk Semiconductor " of the "IEEE Transactions" issue set forth above. This type of amplifier will work as intended only if the product of semiconductor length and carrier concentration is below some predetermined value. Under this condition, the bulk semiconductor will present a negative resistance to internal currents even if it is not biased at a sufficiently high voltage to give traveling domain oscillations. The main drawback of this amplifier is that, because of the limitation on the product of semiconductor length and carrier concentration, its power capabilities are limited.

It is an object of this invention to amplify high frequency energy, especially microwave energy, by the use of a two-valley semiconductor bulk diode.

These and other objects of the invention are attained in an illustrative embodiment thereof comprising a two-valley semiconductor diode connected to the second port of a three-port circulator. Input signal wave energy is delivered to the first port of the circulator, is transmitted from the second port to the diode, is reflected from the diode back to the second port, and is then transmitted by the circulator to a load connected to the third port. The purpose of the diode is of course to amplify the signal energy which is reflected back to the circulator.

In accordance with the invention, the semiconductor diode is appropriately constructed and biased at a sufficiently high direct-current voltage to excite within it traveling domain oscillations. It can be shown that when a two-valley bulk semiconductor diode is oscillating in this manner, it exhibits an external negative conductance in addition to the negative conductance within each traveling domain. Hence, under proper conditions, high frequency signal wave energy transmitted through the oscillating diode will become amplified. In order to give the domain a sufficient time to readjust itself after a change of external voltage, the duration of each period of signal waves should be larger than the negative dielectric relaxation time for domain formation.

As is known, a resonant circuit connected to a two-valley device is required for sustaining traveling domain oscillations in the device. In one embodiment of the invention, a low pass filter is connected between the circulator and the diode. The filter passes signal wave energy and reflects the higher frequency oscillations to form with the terminated end of the line a resonator which is resonant at the oscillation frequency. If the signal frequency is larger than the oscillation frequency a high pass filter is used. In another embodiment, a waveguide stub which is an integral number of half wavelengths long at the traveling domain oscillation frequency is connected to the transmission line between the diode and the circulator. The waveguide stub acts as the resonator with respect to the diode oscillations and does not interfere with the signal frequency because at the point of connection with the transmission line the oscillation voltage is at a minimum. Other embodiments incorporating the invention will also be described.

These and other objects, features and advantages of our invention will be better understood from a consideration of the following detailed description, taken in conjunction with the accompanying drawing in which.

Figure 1:
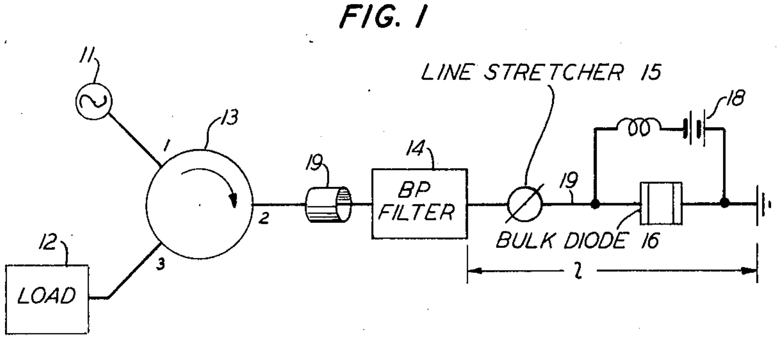
FIG. 1 is a schematic illustration of one embodiment of the invention.

Referring now to FIG. 1, there is shown schematically a circuit for amplifying microwave frequency energy from a source 11 and transmitting it to a load 12. The source is connected to a first port of a circulator 13 that directs the signal energy through port 2 to a coaxial transmission line 19, a band pass filter 14, a line stretcher 15, and a two-valley bulk diode 16. The signal energy is then reflected from the end of the transmission line back to the second port of the circulator and is transmitted through the third port to the load 12. The diode 16 is biased by a battery 18 at a sufficiently high voltage to induce traveling domain oscillations within the diode. The signal energy transmitted through the diode is amplified by virtue of a negative resistance within the diode associated with the traveling domain oscillations.

The diode 16 is made in a known manner so as to comply with the conditions for forming traveling domain oscillations. It may, for example, comprise a bulk wafer of n-type gallium arsenide contained between opposite ohmic contacts. N-type gallium arsenide has lower and upper energy band minima or "valleys" within the conduction band that are separated by only a relatively small energy gap. The carrier concentration is greater in the lower band than in the upper energy band and the mobility of the carriers in the lower energy band exceeds that of the upper energy band carriers.

When an appropriately high voltage is applied between the ohmic contacts, a region of slightly higher resistivity is formed at the negative electrode due to an induced transfer of charge carriers from the lower energy band to the higher energy band where they have a lower mobility. Associated with the higher resistivity region is an accumulation of space charge and an increased localized electric field intensity, referred to as an electric field domain, which is illustrated by the curve 20 of FIG. 2. If potential $E_{th}$ is the applied field required for domain formation, the field intensity within the domain exceeds the initially applied field, while the field intensity outside the domain falls to a value below $E_{th}$, as shown. Once formed, the domain travels toward the positive electrode as shown by the arrow, and grows in intensity due to a further transfer of current carriers from the lower to the upper energy band. After the traveling domain reaches the positive electrode, the carriers in the upper band fall back into the lower band, the domain is extinguished, and the process is repeated.

In the circuit of FIG. 1, a resonator of electrical length $l$, with a resonant frequency approximately equal to the domain oscillation frequency of the diode, is defined in the transmission line between the band pass filter 14 and the termination of the transmission line. The filter 14 is designed to pass the signal frequency but to reflect the diode oscillation frequency. The transmission line resonator is tuned by adjusting line stretcher 15 so that the oscillatory output of the diode has a narrow line width which is substantially entirely outside the pass band of the filter 14. This of course restricts the oscillation energy to the transmission line resonator and prevents it from being transmitted to the load and interfering with the signal frequency.

Figure 2:
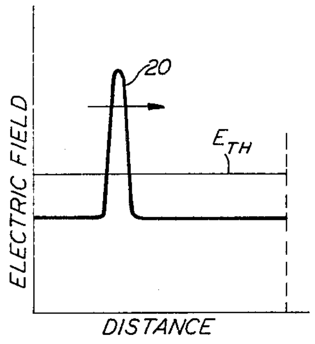
FIG. 2 is a graph of electric field versus distance in the two-valley semiconductor device of FIG. 1.

Consider next the various conditions and criteria that should be met for designing the diode 16 and the circuit of FIG. 1. First, the diode 16 should be capable of generating traveling domain oscillations, which, as is known, requires that the dielectric relaxation time for domain formation within the homogeneous two-valley semiconductor wafer be smaller than the transmit time of the domain across the wafer, or:

$$\tau < \frac{L}{v_D} \qquad (1)$$

where $\tau$ is the dielectric relaxation time for domain formation, L is the length of the wafer between opposite ohmic contacts, and $v_D$ is the velocity with which the domain travels from one contact to the other as illustrated in FIG. 2. As is known, the dielectric relaxation time is given by, $$\tau = \frac{\epsilon}{q|-\mu|n_o} \qquad (2)$$

where $\epsilon$ is the dielectric constant, $q$ is a charge of a carrier within the wafer, $\mu$ is the average negative mobility, and $n_o$ is the ionized donor or acceptor density. This leads to the known condition for traveling domain oscillation, $$n_oL > \frac{v_D\epsilon}{q|-\mu|} \qquad (3)$$

For n-type gallium arsenide Equation 3 may be expressed as $$n_oL > 10^{12} \text{ cm.}^{-2} \qquad (4)$$

The period of each cycle of the signal wave should have a longer duration than the dielectric relaxation time for domain formation within the wafer in order to give the domain sufficient time to readjust itself after a change of external voltage, or, $$\frac{1}{f_s} > \tau \qquad (5)$$

where $f_s$ is the signal frequency. For n-type gallium arsenide, this leads to the condition, $$\frac{f_s}{n_0} < 2 \cdot 10^{-5} \text{ cm.}^3 \text{ sec.}^{-1} \qquad (6)$$

If the current versus voltage characteristics of a two-valley bulk diode are plotted for different wafer length, it can be seen that the linear portions of the negative conductance region occurs at lower applied D-C voltages as the length becomes smaller. Hence, for maximum efficiency, it is preferable that the length of the wafer be made as small as possible. On the other hand, the carrier concentration $n_o$ should be as large as possible for maximum R-F power output. However, as is known, the carrier concentration cannot be made arbitrarily high because, above certain limits, two-valley materials will not exhibit the negative mobility required for domain formation. For n-type gallium arsenide presently available, $n_o$ should be less than $10^{18}$ cm.$^{-3}$. The heating which accompanies device operation usually constitutes an even lower limit of carrier concentration. For presently available n-type gallium arsenide having a cross-sectional area (in a plane parallel with the ohmic contacts) of $10^{-4}$ square centimeters, the carrier concentration should not exceed $10^{16}$ cm.$^{-3}$; otherwise the device will "burn out."

Care should be taken in designing the circuit of FIG. 1 so that the filter 14 does not increase the impedance seen by signal wave energy reflected from the diode; unless the filter constitutes a virtual short-circuit to signal wave energy, it may reflect some signal wave energy and therefore produce instabilities. The circuit of FIG. 3 avoids entirely the use of a filter by employing instead a waveguide resonator 320 connected to the transmission line 319. A probe 321 connected to the inner conductor of transmission line 319 couples the oscillatory energy of the diode to the waveguide resonator 320. By making the resonator 320 an integral number of half wavelengths long at the oscillation frequency, the oscillation voltage at the interconnection of the waveguide with the coaxial cable will be at a minimum. This prevents oscillatory energy from propagating toward port 2 of the circulator 313 and therefore prevents interference with the signal wave propagating in the transmission line 319. The frequency band of the signal wave should be outside the frequency band of resonator 320 to avoid signal wave excitation of the resonator. Spurious susceptances in the transmission line 319 can be minimized by locating the resonator 320 as close as possible to the diode 316; also, the sample then oscillates under a constant voltage condition. It is recommended that the resonator be tuned by moving a tuning plunger 322 in the waveguide resonator with the diode 316 oscillating but without the signal source being connected to the circulator. When the resonator is properly tuned, no output oscillations will be transmitted through the circulator to port 3.

Figure 3:
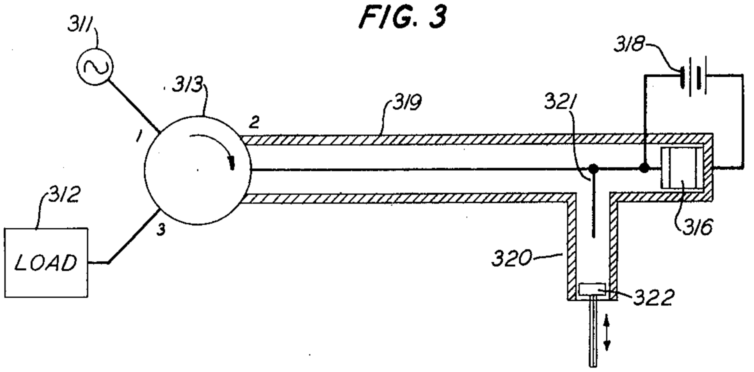
FIG. 3 is a schematic illustration of another embodiment of the invention.

The circuit in FIG. 3 has been built with a 50 ohm coaxial cable transmission line as transmission line 319 and an n-type gallium arsenide bulk diode as diode 316. The cross-sectional area of the semiconductor wafer was $10^{-4}$ square centimeters, the length of the wafer between opposite ohmic contacts, 20 microns, and the carrier concentration $4 \times 10^{15}$ cm.$^{-3}$. The diode generated traveling domain oscillations at 8 gigahertz with a D-C bias voltage of 10 volts. The length of the probe 321 was chosen to present an open circuit at 6 gigahertz. A gain of 5 decibels was exhibited over a bandwidth of 100 megahertz at a signal center frequency of 6 gigahertz, and an average gain of 3 decibels occurred with signal frequencies of from 5.5 gigahertz to 6.5 gigahertz. Gain compression of 1 db occurred at 60 milliwatts output power with a 9 db gain. With signal frequencies of between 5.5 and 6.5 gigahertz, the noise figure was between 18 and 21 decibels, which, it should be noted, compares favorably with some present commercially available traveling wave tube microwave amplifiers.

Figure 4:
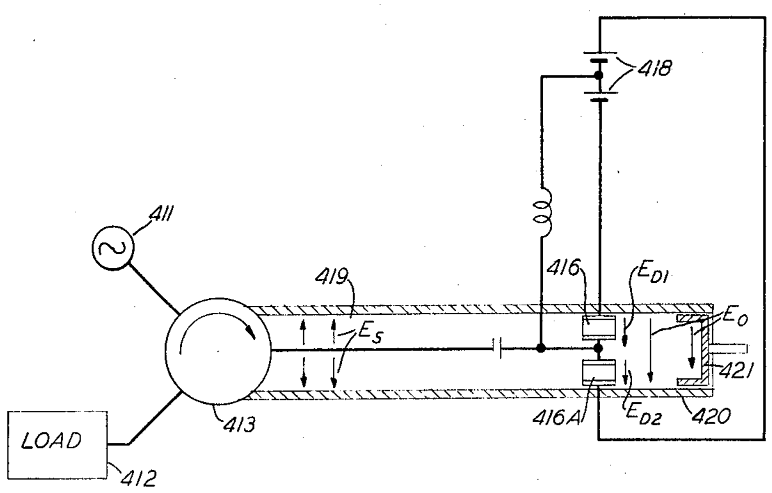
FIG. 4 is a schematic illustration of another embodiment of the invention.

An alternative embodiment is shown in FIG. 4 in which two identical two-valley bulk diodes 416 and 416A are each connected between the ends of inner and outer conductors of a coaxial transmission line 419. A waveguide resonator 420 having a tuning plunger 421 is also connected to the end of the coaxial transmission line. The diodes 416 and 416A are biased by battery 418 such that the positively poled contact of diode 416 is connected to the negatively poled contact of diode 416A.

A conventional characteristic of coaxial cable transmission is that the electric fields of propagating waves extend radially from the inner conductor to the outer conductor, as illustrated by the vectors $E_s$, which indicate the electric field direction of the signal frequency wave from the source 411. On the other hand, electric fields propagating in a waveguide in the $TE_{10}$ mode extend between opposite waveguide walls, as illustrated by the vectors $E_o$. With diodes 416 and 416A biased as shown, the traveling domains in the wafer of both diodes travel in the same direction from the negative to the positive contact (in the drawing domain travel is vertically downwardly in both diodes). As a result, the electric fields $E_{D1}$ accompanying the domains of the diode 416 extend in the same direction as the electric fields $E_{D2}$ accompanying the domains of diode 416A.

Fields $E_{D1}$ and $E_{D2}$ extending in the same direction are appropriate for exciting the waveguide resonator 220 in the $TE_{01}$ mode with oscillation energy. With the coaxial cable designed in a manner known in the art to be incapable of propagating energy in the $TE_{01}$ mode at the oscillation frequency, the diode fields $E_{D1}$ and $E_{D2}$ cancel each other in the coaxial cable and will not excite a wave Hence, the resonator 420 is isolated from the transmission line.

Figure 5:
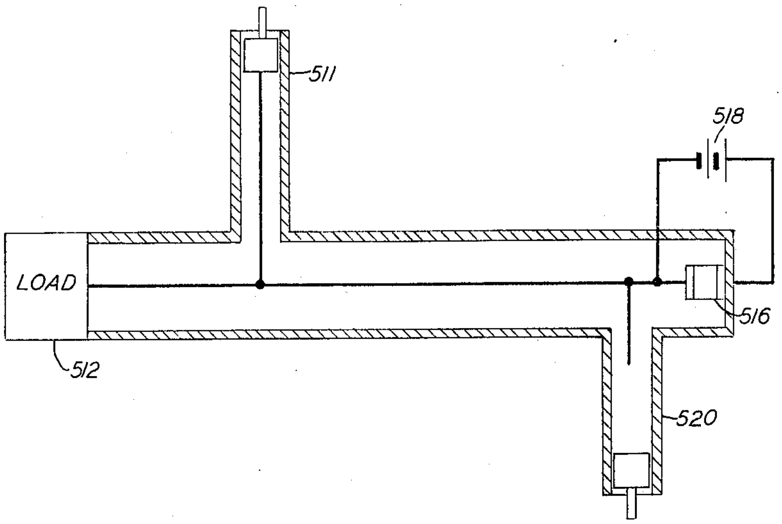
FIG. 5 is a schematic illustration of another embodiment of the invention.

Since, as described above, a two-valley diode is capable of amplifying at frequencies other than its traveling domain oscillation frequency, it should also be capable of oscillating at such frequencies. FIG. 5 shows an oscillator circuit that is analogous to the amplifier of FIG. 3 and operates on the same principle as the FIG. 3 amplifier. When diode 516 is biased at an appropriate voltage it excites resonator 520 which is resonant at the diode oscillation frequency, and resonate 511 which is resonant at the signal frequency, and is analogous to signal source 311 of FIG. 3. Resonator 520 maintains the traveling domain oscillations in the diode, while oscillations at the signal frequency are sustained by the negative resistance of the diode. As before, resonator 520 is an integral number of half wevelengths long to prevent traveling domain oscillation frequencies from propagating to the load 512. The frequency characteristics of resonator 511 should conform to the condition required for the signal frequency 311 of FIG. 3.

The embodiments shown and described are intended only to be illustrative of the inventive concept. Various modifications may be made thereto without departing from the spirit and scope of the invention.

What is claimed is:

1. A circuit comprising:
a two-valley semiconductive device connected to a transmission line;
means connected to the transmission line for defining a resonant circuit;
means including the resonant circuit for establishing traveling domain oscillations in the semiconductive device, said oscillations being in part characterized by a predetermined dielectric relaxation time within the device;
and means for applying high frequency signal wave energy to be amplified to the transmission line, the duration of each cyclical period of the signal waves being larger than said dielectric relaxation time.

2. The circuit of claim 1 wherein:
the semiconductive device comprises a semiconductor wafer included between opposite ohmic contacts;
the product of the carrier concentration $n_o$ and the length L of the wafer between opposite ohmic contacts conforms to the relationship $$n_oL > \frac{v_D\epsilon}{q|-\mu|}$$

where $v_D$ is the carrier drift velocity, $\epsilon$ is the dielectric constant, $q$ is a charge of a carrier within the wafer, and $-\mu$ is the average negative mobility of the wafer;
the carrier concentration is sufficiently high to permit the formation of traveling domains within the wafer;
and the length L is substantially as small as possible consistent with the aforesaid conditions, thereby to maximize device efficiency.

3. The circuit of claim 1 wherein:
the resonant circuit defining means comprises a filter included in the transmission line between the semiconductive device and the signal wave energy applying means;
said filter constituting means for transmitting signal wave energy and means for reflecting energy of the frequency of said traveling domain oscillations.

4. The circuit of claim 1 wherein:
the transmission line comprises a coaxial transmission line;
and the resonant circuit defining means comprises a waveguide connected to the coaxial transmission line, the waveguide being an integral number of half wavelengths long at the frequency of said traveling domain oscillations;
the signal frequency being outside those frequencies at which the resonant circuit resonates.

5. The circuit of claim 1 wherein:
the semiconductive device comprises a wafer of n-type gallium arsenide;
and the carrier concentration $n_o$, the length L of the wafer between opposite ohmic contacts, and the wave energy frequency $f_s$ comply with the relations, $$n_oL > 10^{12}\ \text{cm.}^{-2}$$

$$\frac{f_s}{n_o} < 2\cdot 10^{-5}\ \text{cm.}^3\ \text{sec.}^{-1}$$

6. The circuit of claim 1 wherein:
the transmission line is a coaxial cable;
two substantially identical two-valley semiconductor devices are connected between inner and outer conductors of an end of the coaxial cable such that traveling domains in the two devices travel in the same direction;
and the resonant circuit comprises a waveguide connected to the end of the coaxial cable, said waveguide being capable of excitation in the $TE_{01}$ mode by traveling domain oscillations.

7. The circuit of claim 1 further comprising:
a three-port circulator;
the transmission line being connected to a second port of the circulator;
a load being connected to the third port of the circulator;
and wherein the means for applying signal wave energy comprises a signal wave source connected to a first port of the circulator.

8. The circuit of claim 1 wherein:
the means for applying signal wave energy comprises a signal resonator which is resonant at the signal frequency and is connected to the transmission line;
the resonant frequency of the signal resonator being outside of any frequency band at which the resonant circuit is resonant.

9. An amplifier comprising:
means including a two-valley semiconductive device for generating high frequency oscillations;
means for applying to said oscillation generating means signal frequency energy at a frequency different from the frequency of said oscillations and for abstracting from said oscillation generating means energy at said signal frequency for amplifying the signal energy;
and means intermediate the signal applying means and the oscillation generating means for isolating said high frequency oscillations from said signal applying means.

References Cited

Thim et al., "Applied Physics Letters," Sept. 15, 1965, pp. 167–168.

ROY LAKE, Primary Examiner

D. R. HOSTETTER, Assistant Examiner

U.S. Cl. X.R.

330—34, 56; 331—107, 101, 132